United States Patent [19]

Hidler et al.

[11] Patent Number: 4,544,091
[45] Date of Patent: Oct. 1, 1985

[54] TARGET BONDING PROCESS

[75] Inventors: Henry Hidler, Danvers; Ernest Davey, Peabody; Lawrence L. Hope, Stow; Robert Shimer, Topsfield, all of Mass.

[73] Assignee: GTE Products Corporation, Stamford, Conn.

[21] Appl. No.: 617,159

[22] Filed: Jun. 6, 1984

Related U.S. Application Data

[63] Continuation of Ser. No. 375,625, May 6, 1982, abandoned.

[51] Int. Cl.[4] .............................................. B23K 31/02
[52] U.S. Cl. .................................. 228/124; 228/708; 228/903
[58] Field of Search ............... 228/903, 121, 122, 124, 228/208, 209

[56] References Cited

U.S. PATENT DOCUMENTS

| | | | |
|---|---|---|---|
| 2,800,710 | 7/1957 | Dunn | 228/122 |
| 3,006,069 | 10/1961 | Rhoads et al. | 228/124 |
| 3,173,201 | 3/1965 | Motson | 228/124 |
| 3,733,182 | 5/1973 | Crossland et al. | 228/122 X |
| 3,857,161 | 12/1974 | Hutchins | 228/122 X |

FOREIGN PATENT DOCUMENTS

| | | | |
|---|---|---|---|
| 2161945 | 12/1971 | Fed. Rep. of Germany | 228/123 |
| 53-4020 | 1/1978 | Japan | 228/903 |
| 594561 | 11/1947 | United Kingdom | 228/124 |
| 737144 | 6/1980 | U.S.S.R. | 228/124 |

Primary Examiner—Kuang Y. Lin
Attorney, Agent, or Firm—William H. McNeill; José W. Jimenez

[57] ABSTRACT

A process for bonding one or more target parts, such as yttrium oxide target parts, to a copper backing plate to provide improved mechanical support and improved heat transfer. The process is one in which a noble metal, preferably platinum, is applied to the target to provide an oxide free layer to which indium/lead solder joins. The solder step is performed so that contamination by flux or by formation of an oxide is prevented.

11 Claims, 2 Drawing Figures

TARGET BONDING PROCESS

This application is a continuation of application Ser. No. 375,625, filed May 6, 1982, and now abandoned.

TECHNICAL FIELD

The present invention relates to a target bonding process and, more particularly, to an improved process for bonding a sputtering target to a backing plate, such as a copper backing plate.

BACKGROUND OF THE INVENTION

Dielectric thin films are used in many devices, such as display devices or capacitors. Particularly in electroluminescent display devices, the dielectric thin film may be one of yttrium oxide. An economic technique for preparing the thin film is by high rate sputtering using vacuum equipment including a vacuum chamber. The source material for sputtering is in the form of a sputtering target, comprising one or more solid pieces from which material is evolved by ion bombardment. The target is usually mounted on a backing plate. High power loading needed for high sputtering rates results in a need for substantial heat dissipation through the rear side of the target to the backing plate. The backing plate is usually made of copper or some other good heat conductor.

A number of problems have been encountered in the forming of a stable, intimate bond between the target and its backing plate. For instance, mechanical bond failure has occurred wherein the target separates from the backing plate. Targets are often mounted vertically to minimize contamination and there is a tendency for them to separate from the backing plate if the bond is weak. Another problem encountered is the cracking of the target due to inadequate heat transfer between the target and its backing plate. This problem is exacerbated in the case of magnetron sputtering, used for high rates, wherein the surface of the target is not heated uniformly. Another problem that has been encountered is the evolution of contaminants from the bonding material. For example, epoxies evolve organics that ruin the thin film. A bonding material of solder might be considered, but it has been found that solder materials do not stick effectively to a dielectric layer such as one of yttrium oxide, nor to a wide class of other materials such as ceramics.

DISCLOSURE OF THE INVENTION

It is, therefore, an object of this invention to obviate the disadvantages of the prior art.

It is another object of the invention to enhance target bonding.

These objects are accomplished, in one aspect of the invention, by a process for bonding a target to a heat conductive backing plate. The process comprises applying a substantially oxide-free, noble metal layer to a target; applying a solder layer to the backing plate; and removing traces of flux used in applying the solder layer. The backing plate and target are maintained in a dry atmosphere and a solder-layer is applied to the target and maintained soft. The solder layer on the backing plate is heated and the backing plate and target are joined to form a combination solder and noble metal layer as a bond therebetween.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
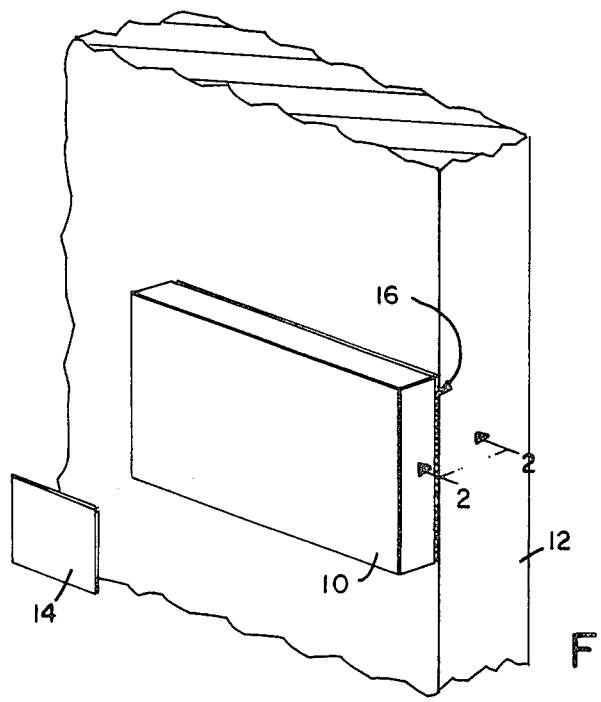
FIG. 1 is a perspective view schematically illustrating the target and associated backing plate and associated substrate to which the target material layer is deposited by sputtering.

Referring now to the drawings with greater particularity, there is shown in FIG. 1 a schematic diagram illustrating a target 10 and associated backing plate 12 having a substrate 14 positioned in proximity thereto. The target 10, backing plate 12 and substrate 14 are typically disposed in a vacuum sputtering chamber. For example, the target 10 may be one of yttrium oxide for sputtering onto the substrate 14 a yttrium oxide layer. FIG. 1 may represent one step in the formation of an electroluminescent display as represented by the deposition of the dielectric yttrium oxide layer by sputtering.

Figure 2:
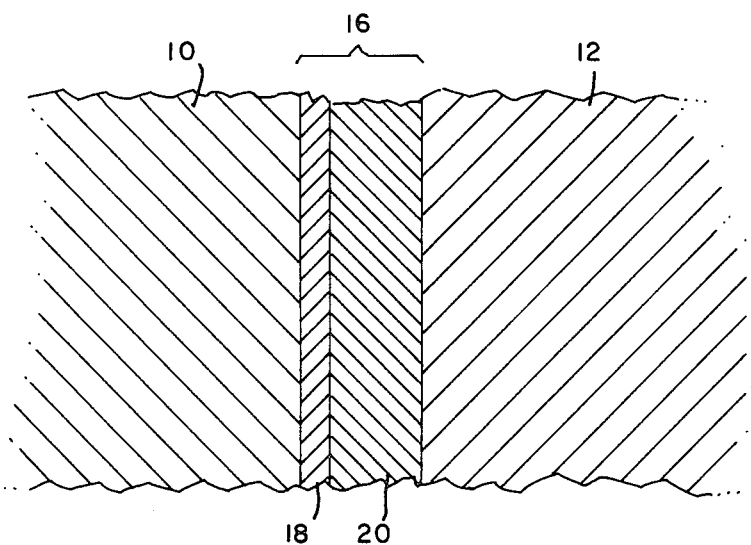
FIG. 2 is an enlarged cross sectional view showing the nature of the bond between the target and backing plate.

FIG. 2 illustrates in detail the bonding layer 16 formed in accordance with the process of the present invention for providing a uniform and positive seal between the target 10 and the backing plate 12. In FIG. 2 the bonding material is shown as represented by a platinum layer 18 and a solder layer 20.

In accordance with the process described herein, a substantially oxide-free noble metal, such as platinum, is applied to the target material so as to provide a substantially oxide-free layer to which a solder, such as indium/lead solder, is capable of sticking. The solder operation is carried out in such a manner that contamination by flux or formation of an oxide is prevented. The process of the present invention may be employed, e.g., using verical magnetron sputtering with a power of 1000 watts.

Although not illustrated in FIG. 1, the backing plate 12 is typically provided with a recess into which one or more targets 10 are adapted to fit. For simplicity in FIG. 1, only a single target 10 is shown. The first basic step in the process is to apply a substantially oxide-free noble metal layer 18 to the target 10. The preferred layer is one of platinum. This is applied by using a platinum organometallic paint. The target material may be, for example, yttrium oxide. The platinum organometallic paint is applied to the target 10 as it is held upside down or inverted. This orientation is used so as to prevent spill-over onto the sides of the target. A rubber suction cup and vacuum line may be used to hold the target on its top surface as it is painted on the bottom surface. The so-called bottom surface is the one subsequently to be applied to the backing plate 12 as illustrated in FIG. 1.

After the platinum organometallic paint is applied, an oven is used to fire the target part or parts in air at 340° C. A probe may be used for temperature sensing. This firing may occur over an extended period of time such as five hours. After the firing (heating) step the oven is turned off and the targets are permitted to cool slowly, all the time maintaining the oven door closed. The yttrium oxide target is checked to determine if it is properly coated. If there are black areas appearing on the target, this is an indication that all of the organic materials in the organometallic paint have not been driven off. The purpose of the firing in the oven is to drive off such organic materials leaving only the platinum material on the target. The slow cooling with the oven door closed is used to prevent thermal shock so that the target will not crack during this step of application of the platinum layer. The target part is also to be checked for uniformity of the platinum layer and, if necessary, repainting may be carried out.

The next step in the process is to clean the copper backing plate 12. This cleaning step may include the use of a degreaser along with the use of a seventy percent hydrochloric acid solution with a water rinse. This may be followed by a deionized water rinse.

The next step after cleaning the copper backing plate is to tin the backing plate. For this purpose a solder of indalloy #7 is used. This solder is fifty percent lead and fifty percent indium. The liquidus temperature is 209° C. (408° F.) and the solidus temperature is 180° C. (356° F.) The density is 8.86 g/cm$^3$.

After the copper backing plate has been tinned, all traces of any flux used on the copper are removed. Also, the surface is checked to make sure that the entire surface wets.

The next steps in the process involve the use of a dry box with associated load lock. The backing plate, target pieces, solder, tongs, weights, thermocouple probe unit, and two hot plates are disposed in the dry box. The load lock is pumped down and after a waiting period of about 20 minutes the atmosphere from the load lock enters the dry box. With the target parts in the dry box, and with the platinum previously applied to the target parts, these target parts are then tinned by heating the parts to on the order of 220° C. On one of the hot plates. The thermocouple probe unit is used to sense the temperature. The tinning operation may be carried out with the use of a solder foil. Again, as with the application of solder to the copper backing plate, the target parts are checked to assure that there is complete wetting over the surface of the target parts that will face the backing plate and engage with the backing plate.

The dry box and its associated load lock are conventional devices. A nitrogen atmosphere may be used coupled from the load lock to the dry box. The dry box is used to substantially eliminate humidity and avoid forming a copper oxide or other oxide on the backing plate and target parts.

After the target parts have been tinned, the second hot plate is used to heat the backing plate. A small amount of additional solder may be applied. The second hot plate is operated so as to maintain the solder on the copper backing plate wet (soft), such as at a temperature of 220° C. The first hot plate operates to maintain the second solder layer soft, such as at a temperature of 220° C. With both solder layers now heated and wet the tongs can be used to flip the tinned target parts onto the hot tinned copper backing plate in the appropriate position. The order of placing the target parts may be important particularly for mosaic targets due to bevels that are typically used with these targets. The target parts are then slipped into final position under hand pressure, if necessary, and to assure intimate mating contact between the target parts and backing plate. Separate tungsten weights may be used on each part to hold it in place on the backing plate. The hot plates are turned off and the backing plate and target parts are allowed to cool. The completely integrated backing plate and target parts are then removed from the dry box when they have completely cooled.

With the process of the present invention there has now been formed a bond between the target part or parts and the copper backing plate which is characterized by a good mechanical support therebetween and, furthermore, by improved heat transfer therebetween. This bonding material is substantially free of any contaminant that might otherwise ruin the thin film formed on the substrate.

Having described one embodiment of the process of this invention, it should be apparent to those skilled in the art that numerous other embodiments are contemplated as falling within the scope of this invention. Although platinum has been described as being used in applying the base layer to the target parts, it is understood that other noble metals may be employed. Also, the process of this invention may be carried out with various types of targets in addition to the yttrium oxide material target described herein.

We claim:

1. A process for bonding a sputtering target to a heat conductive backing plate for subsequent use in a sputtering operation, said process comprising the steps of:
    applying a substantially oxide-free noble metal layer over one side of said sputtering target, said step of applying the noble metal layer comprising providing the noble metal in an organometallic paint, applying said paint to said sputtering target, heating said sputtering target to drive off organics and leave substantially only the noble metal as a layer covering at least a part of said sputtering target;
    applying a first solder layer to a specific area of said backing plate;
    removing traces of flux used in applying said first solder;
    maintaining said backing plate and said sputtering target in a dry atmosphere;
    applying a second solder layer over said noble metal layer on said sputtering target and maintaining said second solder layer soft; and
    heating said first solder layer on said backing plate and joining said first solder layer on said backing plate and said second solder layer on said sputtering target to form a combination solder and noble metal layer as a bond between said sputtering target and said backing plate.

2. A process as set forth in claim 1 wherein said heating step to drive off organics provides heating at on the order of 340° C. for on the order of five hours.

3. A process as set forth in claim 1 further including cooling said target after heating to drive off organics.

4. A process as set forth in claim 1 wherein said backing plate is cleaned prior to applying the solder layer thereto.

5. A process as set forth in claim 1 wherein said backing plate and said target are maintained in a dry atmosphere by means of a dry box.

6. A process as set forth in claim 5 including providing first and second hot plates in said dry box, said second hot plate for applying and maintaining said second solder layer on said target, and said first hot plate for heating said backing plate.

7. A process as set forth in claim 6 wherein said first hot plate heats to a temperature on the order of 220° C.

8. A process as set forth in claim 6 wherein said second hot plate heats to a temperature on the order of 220° C.

9. A process as set forth in claim 6 wherein a small amount of solder is added to said first solder layer on said backing plate as said backing plate is heated.

10. A process as set forth in claim 1 wherein weights are placed upon said sputtering target after said sputtering target is placed upon said backing plate.

11. A process as set forth in claim 1 wherein said oxide free noble metal is platinum.

* * * * *